United States Patent [19]

Stangle et al.

[11] Patent Number: 5,660,772
[45] Date of Patent: *Aug. 26, 1997

[54] PROCESS FOR MAKING ULTRA-FINE BARIUM HEXAFERRITE PARTICLES

[75] Inventors: Gregory C. Stangle, Alfred; Koththavasal R. Venkatachari, Rochester; Steven P. Ostrander, Scotia; Walter A. Schulze; John D. Pietras, both of Alfred Station, all of N.Y.

[73] Assignee: Alfred University, Alfred, N.Y.

[ * ] Notice: The term of this patent shall not extend beyond the expiration date of Pat. No. 5,468,427.

[21] Appl. No.: 495,223

[22] Filed: Jun. 27, 1995

Related U.S. Application Data

[63] Continuation-in-part of Ser. No. 127,637, Sep. 27, 1993, Pat. No. 5,468,427.
[51] Int. Cl.$^6$ .......................... C01B 13/34; C01G 49/00; C04B 35/622
[52] U.S. Cl. ........................ 264/6; 264/3.4; 264/7; 264/125; 264/611; 423/138; 423/151; 423/594; 501/126; 427/212
[58] Field of Search .................... 264/3.4, 6, 56, 264/65, 66, 125, 7; 501/126, 123; 427/212; 423/138, 143, 594, 151, 633

[56] References Cited

U.S. PATENT DOCUMENTS

| | | |
|---|---|---|
| 4,065,544 | 12/1977 | Hamling et al. . |
| 4,671,885 | 6/1987 | Gaud et al. . |
| 4,781,852 | 11/1988 | Kaczur et al. . |
| 5,061,682 | 10/1991 | Aksay et al. . |
| 5,135,733 | 8/1992 | Robert et al. . |
| 5,232,617 | 8/1993 | Sarda et al. . |

*Primary Examiner*—Melvin Mayes
*Attorney, Agent, or Firm*—Howard J. Greenwald

[57] ABSTRACT

A process for producing ultra-fine barium hexaferrite particles. In the first step of this process, a ceramic precursor material containing barium and trivalent ferric cations, a nitrogen-containing material, a solvent, and an anion capable of participating in an anionic oxidation-reduction reaction with the nitrogen-containing material, is provided. In the second step of the process, droplets of such ceramic precursor material are formed. In the third step of the process, the droplets are dried until particles which contain less than about 15 weight percent of solvent are produced. In the fourth step of this process, such particles are ignited in an atmosphere which contains substantially less than about 60 weight percent of the solvent's saturation value in such atmosphere.

12 Claims, 2 Drawing Sheets

5,660,772

PROCESS FOR MAKING ULTRA-FINE BARIUM HEXAFERRITE PARTICLES

CROSS-REFERENCE TO RELATED PATENT APPLICATIONS

This case is a continuation-in-part of patent application U.S. Ser. No. 08/127,637, filed Sep. 27, 1993, now U.S. Pat. No. 5,468,427.

FIELD OF THE INVENTION

A combustion process for making ultra-fine barium hexaferrite particles and for preparing fired articles therefrom.

BACKGROUND OF THE INVENTION

Barium hexaferrite, which is represented by the formula $BaFe_{12}O_{19}$, is a hard magnetic material whose preparation and properties is discussed in U.S. Pat. No. 4,781,852; the disclosure of this United States patent is hereby incorporated by reference into this specification.

It is an object of this invention to provide an economical process for the preparation of ultra-fine barium hexaferrite particles.

SUMMARY OF THE INVENTION

In accordance with this invention, there is provided a process for producing ultra-fine barium hexaferrite particles. In the first step of this process, a ceramic precursor material containing barium and trivalent ferric cations, a nitrogen-containing material, a solvent, and an anion capable of participating in an anionic oxidation-reduction reaction with the nitrogen-containing material, is provided. In the second step of the process, droplets of such ceramic precursor material are formed. In the third step of the process, the droplets are dried until particles which contain less than about 15 weight percent of solvent are produced. In the fourth step of this process, such particles are ignited in an atmosphere which contains substantially less than about 60 weight percent of the solvent's saturation value in such atmosphere.

DESCRIPTION OF THE PREFERRED EMBODIMENTS

Figure 1:
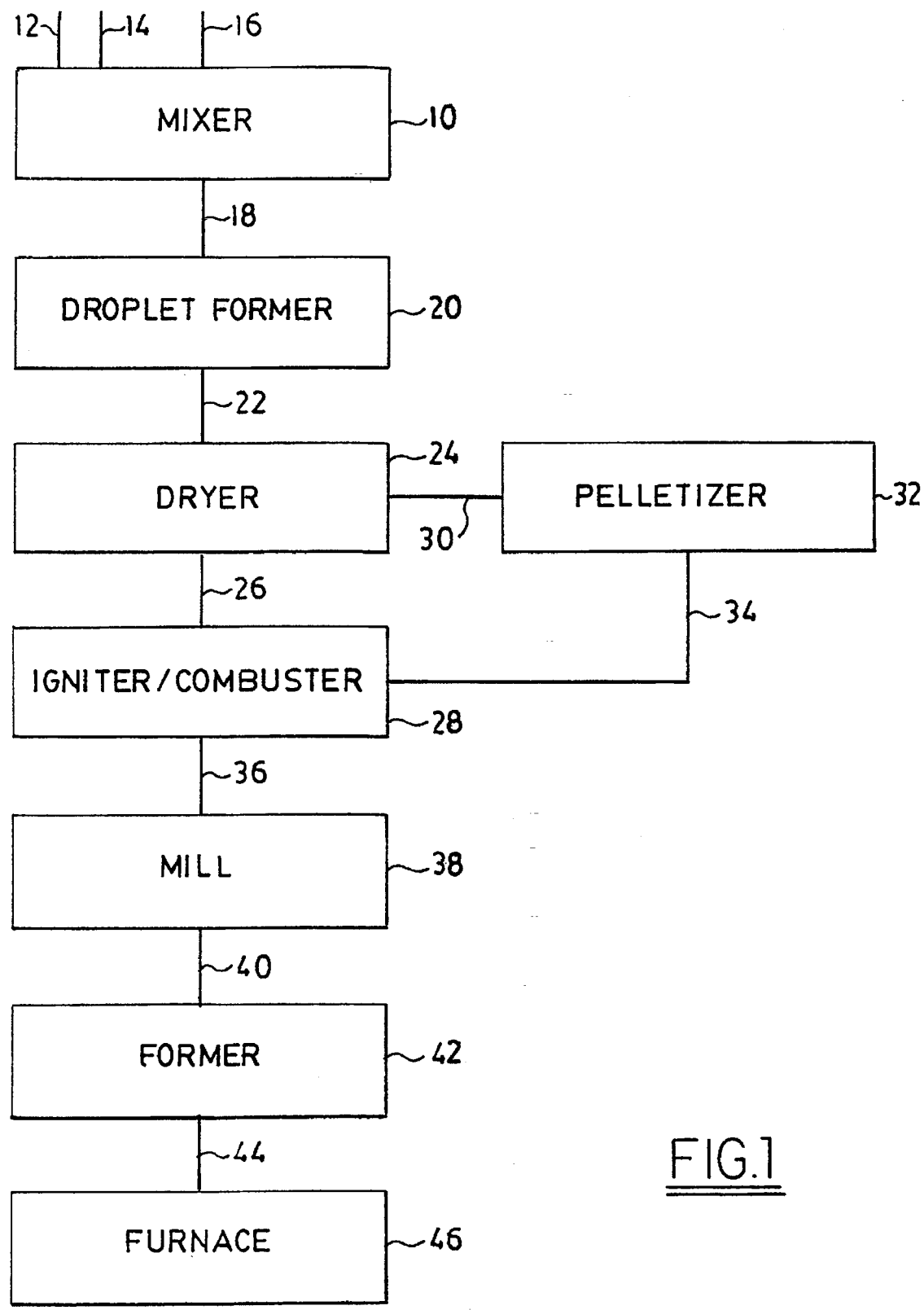

FIG. 1 is a schematic diagram of one preferred embodiment of applicants' process.

Referring to FIG. 1, to mixer 10 is charged a metal cation via line 12. The metal cation corresponds to the metal oxide which one ultimately wishes to obtain in the fired body produced by the process.

By way of illustration, and with reference to the January, 1991 issue of Ceramic Industry (Business News Publishing Company, 755 West Big Beaver Road, Suite 1000, Troy, Mich.), the metal oxide material to be produced by the process may be albite, alumina, aluminum silicate, aluminum titanate, andalusite, antimony oxide, arsenic oxide, barium aluminate, barium oxide, barium titanate, barium tungstate, barium zirconate, bentonite, beryl, beryllium oxide, bismuth stannate, bismuth titanate, bismuth zirconate, borax, cadmium oxide, cadmium zirconate, calcium antimonate, calcium titanate, cerium oxide, chromium oxide, clinochlore, cobalt oxide, copper oxide, cordierite, cristobalite, erbium oxide, europium oxide, forsteite, gadolinium oxide, gallium oxide, germanium dioxide, halloysite, hectorite, holmium oxide, ilmenite, indium oxide, iron oxide, kyanite, lanthanum oxide, lead oxide, lead zirconate titanate, lutetium oxide, magnesium oxide, manganese dioxide, molybdic oxide, mullite, neodymium oxide, nepheline, nickel oxide, niobium oxide, olivine, petalite, praseodymium oxide, pyrolusite, pyrophyllite, rhodium sesquioxide, samarium oxide, scandium oxide, silica, strontium titanate, superconductors, terbium oxide, thorium oxide, titania, vanadium pentoxide, ytterbium oxide, zirconia, mixtures thereof, and the like.

By way of further illustration and not limitation, the metal in the metal cation compound may be zirconium (whose cation ultimately will form zirconia), a mixture of barium and titanium (whose cation ultimately will form barium titanate), a mixture of yttrium, barium, and copper in a molar ratio of 1:2:3 (whose cation will form the 1:2:3 yttrium barium cuprate superconductor), aluminum (whose cation will form alumina), a mixture of zirconium and yttrium (whose mixture will form yttria-stabilized zirconia), a mixture of zirconium and magnesium (whose mixture will form magnesia-stabilized zirconia), a mixture of yttrium and aluminum (whose cation will form yttirum-aluminum garnet), a mixture of aluminum and titanium (whose cation will form aluminum titanate), and the like. Those skilled in the art will be aware of the existence of many other metal cations, or mixtures of metal cations, whose oxidation products will form desired oxides and/or mixtures of oxides.

By way of further illustration, column 5 of U.S. Pat. No. 5,061,682 (the entire disclosure of which is hereby incorporated by reference into this specification) lists various nonsuperconductive ceramic materials which can be made from the ceramic precursor mixture; the same materials may be advantageously made with applicants' process.

As those skilled in the art will appreciate, the stoichiometry of the metals in the mixture in mixer 10 will establish the ratio of the metal oxides in the final product.

The cation of the metal(s) used in the mixture may be any cation which can be incorporated in a compound which is capable of being converted into a metal oxide by heating. By way of illustration and not limitation, one may use the nitrate, the perchlorate, the sulfate, the carbonate, the chloride, the oxalate, the acetate, the hydroxide, and the like as the anion of the metal cation-containing compound, provided that the metal cation compound preferably is soluble in the solvent used in the process.

In one preferred embodiment, the anion in the metal cation-containing compound is nitrate ion. As is known to those skilled in the art, nitrate compounds can usually be caused to decompose readily to yield an oxide.

In one preferred embodiment, a stabilized zirconia is produced by applicants' process. As is known to those skilled in the art, partially stabilized zirconia (PSZ) is a mixture of cubic and tetragonal (or monoclinic) zirconia. Fully stabilized cubic zirconia forms when an appropriate amount of a suitable dopant is added to pure zirconia and heat treated under appropriate conditions of temperature and time.

In one preferred embodiment, yttria-stabilized zirconia is produced by applicant's process. In order to produce such material, one may charge zirconyl nitrate and yttrium nitrate (and/or other suitable anions) via line 12 in a mole/mole ratio such that the mixture contains from about 80 to about 98 mole percent of zirconyl nitrate (by combined moles of zirconyl nitrate and yttrium nitrate) and from about 2 to about 20 mole percent of yttrium nitrate; in the following description, reference will be made to the nitrate anion, it being understood that other anions also may be used.

It is preferred that the mixture contain from about 85 to about 98 mole percent of zirconyl nitrate and from about 2 to about 15 mole percent of yttrium nitrate.

One may use any of the commercially available zirconium and yttrium compounds. Thus, by way of illustration and not limitation, and referring to the 1990–1991 Aldrich catalog (Aldrich Chemical Company, 1001 West Saint Paul Avenue, Milwaukee, Wis.), one may use catalog number 24-349-3 (zirconyl nitrate hydrate), catalog number 23,795-7 (yttrium nitrate pentahydrate), and the like.

By way of further illustration, some or all of the yttrium compound may be replaced by other zirconia stabilizing agents. Thus, one may use magnesium nitrate, calcium nitrate, cerium nitrate, lanthanum nitrate, praseodymium nitrate, neodymium nitrate, erbium nitrate, ytterbium nitrate, gadolinium nitrate, nitrates of the other rare earth metals of group IIIB of the periodic table, mixtures thereof, and the like.

By way of further illustration, one may use a mixture of barium nitrate and a titanium compound in a substantially equimolar mixture adapted to produce barium titanate upon oxidation.

Additionally, or alternatively, one may use a reaction mixture which will produce the desired reactant. Thus, for example, in one embodiment, titanium isopropoxide (Aldrich catalog number 20,527-3) is added to water; and nitric acid (VWR's reagent number VW334-1) is thereafter added to form a mixture to which barium nitrate is then added on a substantially equimolar basis.

Alternatively, or additionally, the oxidizing anion can be introduced into the mixture in a form other than a metal salt.

In one embodiment, the reactant is a salt of a mixture of metals which, upon oxidation, will form a ferrite. As is disclosed in U.S. Pat. No. 5,213,851 (the entire disclosure of which is hereby incorporated by reference into this specification), a ferrite is a ferromagnetic compound containing ferric oxide and may be, e.g., a garnet, a lithium ferrite, a spinel ferrite, a hexagonal ferrite, and the like.

In one embodiment, a mixture of reactants which will form a High Tc ceramic superconductor is used in applicants' process. These high Tc ceramic superconductors are discussed in U.S. Pat. No. 5,157,015, the entire disclosure of which is hereby incorporated by reference into this specification. Thus, in one aspect of this embodiment, yttrium nitrate, barium nitrate, and copper nitrate are introduced into mixer 10 such that the yttrium/barium/copper mole ratio is 1/2/3.

Referring again to FIG. 1, a solvent is charged via line 14. The solvent preferably is selected from the group consisting of water, an alcohol of the formula ROH wherein R is alkyl group of from about 1 to about 8 carbon atoms, and mixtures thereof. When an alcohol is used, it is preferred that it be selected from the group consisting of methanol, ethanol, isopropanol, and butanol.

In one embodiment, it is preferred that the solvent consist essentially of water. In one preferred aspect of this embodiment, the total concentration of the metal cation(s) present in the mixture is a concentration of from about 0.01 to about 1.0 molar. In an even more preferred embodiment, the concentration of the metal compound(s) in the mixture is from about 0.01 to about 0.5 molar.

Referring again to FIG. 1, a fuel is charged via line 16. In general, a sufficient amount of such fuel is charged via line 16 so that it is present in the mixture at a concentration of from about 1 to about 50 weight percent (by combined weight of fuel and metal compound[s] in the mixture). It is preferred to use from about 5 to about 45 weight percent of such fuel.

The fuel used in applicants' process preferably is a compound which contains at least six atoms, at least four hydrogen atoms, and at least one nitrogen atom.

In one embodiment, the fuel is either a semicarbazide (such as Aldrich reagent number 36,363-4) or a derivative of a semicarbazide, such as semicarbazide hydrochloride (Aldrich reagent number S220-1).

In one embodiment, the fuel is carbohydrazide (Aldrich reagent number C1,100-6).

In one embodiment, the fuel is oxalic dihydrazide (Aldrich reagent number 13,129-6).

In one embodiment, the fuel is oxamic hydrazide (Aldrich reagent number 0-930-1).

In general, the fuel may be represented by the formula $R.(HA)_{a}$, wherein R is a nitrogen atom-containing moiety, a is an integer of from 0 to 2, and HA is selected from the group consisting of $HNO_3$, $HCl$, $HBr$, $HI$, $H_2SO_4$, $H_2O$, $CH_3COOH$, and the like.

The R moiety may be represented by the formula

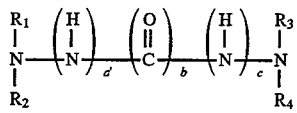

wherein: $R_1$, $R_2$, $R_3$, and $R_4$ are independently selected from the group consisting of hydrogen, alkyl of from 1 to 4 carbon atoms, and phenyl, a' is an integer of from 0 to 2, b is an integer of from 1 to 2, c is an integer of from 0 to 2, and a' plus c is at least 1. It will be appreciated by those skilled in the art that, although the terms "a" and a' are used in describing two different structural entities, and each is an integer of either 0, 1, or 2 in each such entity, it need not be the same in each entity.

The R moiety must contain at least four hydrogen atoms, and it may (but need not) contain one or two oxygen atoms. The ratio of hydrogen atoms to oxygen atoms in the R moiety is at least 3 (and is infinite when no oxygen is present).

In one preferred embodiment, the fuel is water soluble. Furthermore, it is preferred that the fuel have a melting point in excess of 110 degrees centigrade.

Referring again to FIG. 1, the mixture of fuel, solvent, and metal compound(s) is mixed in mixer 10 until a clear solution is obtained. Thereafter, the solution in mixer 10 is formed into droplets.

The droplets may be formed by conventional means. Thus, e.g., referring to column 8 of U.S. Pat. No. 5,061,682 (the entire disclosure of which is hereby incorporated by reference into this specification), the droplets may be formed by atomization, formation of an aerosol, and the like.

In one preferred embodiment, the droplets are formed so that at least about 80 weight percent of such droplets have a maximum dimension of less than about 6 microns. One may produce droplets of this size by the use of an Ultrasonic Nebulizer such as, e.g., the "Ultra-Neb 99" ultrasonic nebulizer sold by the DeVilbiss Health Care, Inc. of Somerset, Pa. 15501. The Instruction Guide which accompanies such Nebulizer (publication A-850 Rev. D, copyright in 1992 by DeVilbiss) discloses (at page 1) that most of the droplets produced by such nebulizer are in the 0.5 to 5.0 micron range, The droplets may be formed by other conventional means. Thus, e.g., one may form the droplets by atomization.

By way of illustration and not limitation, a suitable atomizing apparatus is contained in the Virtis Lab-Plant Spray Dryer (sold by The Virtis Company, Inc. of Route 208, Gardiner, N.Y. 12525). As is disclosed on page 5 of the "Operators Instruction Manual" accompanying this apparatus, "in performing the spray drying process, an integral self priming peristaltic pump draws sample liquid from a user-supplied container, and transfers it through a 0.5 mm. diameter jet nozzle into the main chamber of the dryer. Simultaneously, an integral air compressor pumps air into an outer tube of the jet nozzle. Due to this close proximity of the air outlet to the liquid jet, the fluid sample is atomized, emerging as a fine spray."

As will be apparent to those skilled in the art, many other atomization devices may be used to provide the required droplets. Thus, e.g., one may use spray nozzle atomizers such as the pressure nozzle devices, the two-fluid nozzle devices, and the rotary devices described on page 18–61 of Robert H. Perry et al.'s "Chemical Engineers'Handbook," Fifth Edition McGraw-Hill Book Company, New York, 1973). One may use atomizers that use sonic energy (from gas streams), ultrasonic energy (electronic), and electrostatic energy; see, e.g., Tate (Chemical Engineering, Jul. 19, 1965, page 157 and Aug. 2, 1965, page 111). Thus, e.g., one may use the ultrasonic atomizer disclosed in U.S. Pat. No. 5,213,851, the disclosure of which is hereby incorporated by reference into this specification.

Referring again to FIG. 1, the mixture in mixer 10 is passed via line 18 to droplet forming apparatus 20. The droplets formed in apparatus 20 are then passed via line 22 to dryer 24. As will be appreciated by those skilled in the art, dryer 24 may be a separate apparatus from droplet former 22; alternatively, as in the case of the aforementioned Virtis Lab-Plant Spray Dryer, they may both be contained in the same apparatus.

It is preferred that, in dryer 24, a substantial amount of the solvent (water) be removed from the droplets that the material so produced (particles) contain less than about 15 weight percent of moisture.

The dried particles are then passed via line 26 to separate igniter/combuster 28, wherein they are ignited and caused to combust.

It should be noted that this portion of applicants' process is substantially different from the process of U.S. Pat. No. 5,061,682. In the latter process, as is disclosed at column 11 thereof, the drying chamber 14 includes a NIRO atomizer portable spray dryer 10 which, in turn, contains a cyclone separator 18 adapted to receive the drying air and dry product from the bottom of the drying chamber. The bottom of the cyclone separator 18 includes an outlet 20 that allows the dried particles to gravitate into and/or be swept through a vertically oriented tube furnace 22.

In addition to allowing the passage of the dried particles into furnace 22, outlet 20 also allows the passage of damp air (from cyclone separator 18) into furnace 22. Thus, the ignition which occurs in furnace 22 occurs in the presence of a substantially humid atmosphere.

By comparison, in applicant's process, only the dried particles are charged via line 26 to igniter/combuster 28; substantially none of the humid atmosphere of dryer 24 (which is created by the volatilization of the solvent in the droplets) is allowed to enter igniter/combuster 28. Thus, the atmosphere in igniter/combuster 28 preferably has a relative humidity of less than about 60 percent.

Without wishing to be bound to any particular theory, applicants believe that the use of an ignition/combustion atmosphere with a relative humidity less than about 60 percent will tend to facilitate the ignition of the dried particles and produce an improved reaction in which unwanted side reactions are minimized.

It is preferred to ignite the dried particles in igniter/combuster 24 by subjecting them to a temperature of from about 100 to about 1,000 degrees centigrade. In one preferred embodiment, the particles are subjected to a temperature of from about 500 to about 600 degrees centigrade.

Referring again to FIG. 1, and in one preferred embodiment illustrated therein, the dried particles may be passed via line 30 to pelletizer 32, wherein they may be formed into pellets which, thereafter, are passed via line 34 to igniter/combuster 28 (wherein they may be ignited).

After the ignition of the dried particles, and/or the pellets, the combusted material from igniter/combuster 28 (which now preferably consists essentially of one or more metal oxides), may be passed via line 36 to mill 38. In this embodiment, it is preferred to mill the combusted material in mill 38 so that substantially all of the particles are less than about 0.5 microns in size.

The milled material is then passed via line 40 to former 42, in which it may be formed into a green body by conventional means. Thus, e.g., one may use the forming techniques disclosed on pages 39–68 of J. T. Jones et al.'s "Ceramics: Industrial Processing and Testing" (The Iowa State University Press, Ames, Iowa, 1972). In one preferred embodiment, from about 0.1 to about 1.0 weight percent of binder is incorporated into the green body.

The green body is then passed from former 42, via line 44, to furnace 46. While in such furnace, the green body is heated to a temperature of from about 1,100 to about 1,700 degrees centigrade at a rate of from about 10 to about 1,000 degrees centigrade per minute. It is preferred to heat the green body to a temperature of from about 1,300 to about 1,400 degrees centigrade at a rate of from about 250 to about 750 degrees centigrade per minute.

Once the green body has reached such temperature of from about 1,200 to about 1,400 degrees centigrade, it is maintained at such temperature for at least about 0.5 minutes and, preferably, for from about 1 to about 5 minutes. As will be apparent to those skilled in the art, the fact that applicants can complete the sintering of the green body in as short a period as, e.g., 5 minutes, makes their process economically attractive.

After the green body has been held at such temperature of from about 1,200 to about 1,400 degrees centigrade for at least about 0.5 minute, it is then cooled to ambient temperature at a rate of from about 2 to about 750 degrees centigrade per minute and, preferably, from about 250 to about 750 degrees centigrade per minute.

In one embodiment, more than one cooling rate is used. Thus, by way of illustratration, one may use a rate of about 750 degrees centigrade per minute for the first 300 degrees and, thereafter, cool the material to ambient at a lower rate of, e.g., about 20 degrees centigrade per minute.

Without wishing to be bound to any particular theory, applicants believe that the use of the aforementioned sintering cycle minimizes grain growth in the fired product.

Figure 2:
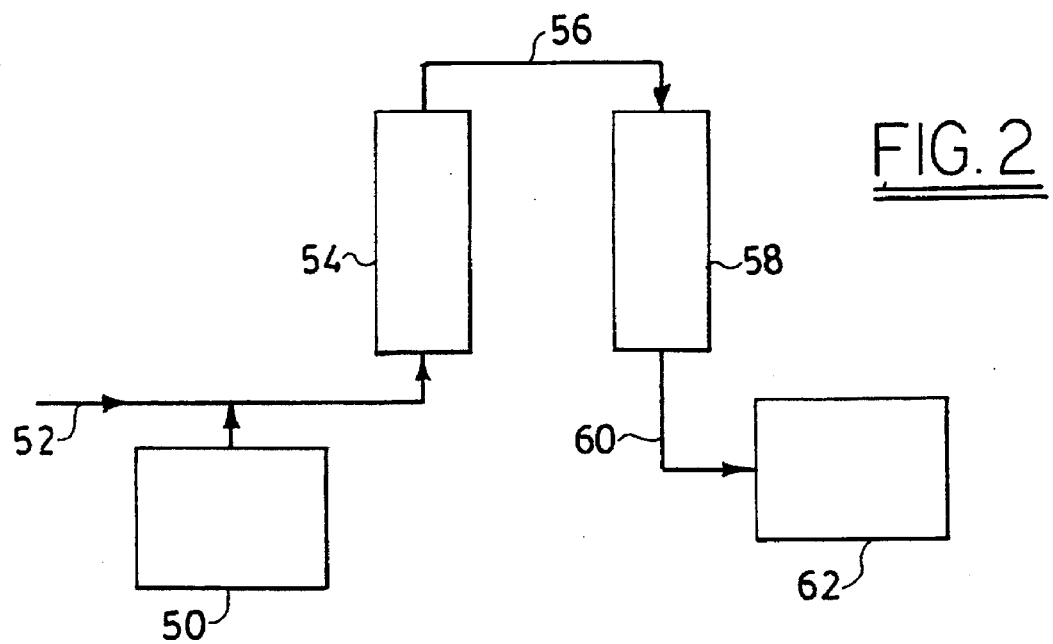
Figure 3:
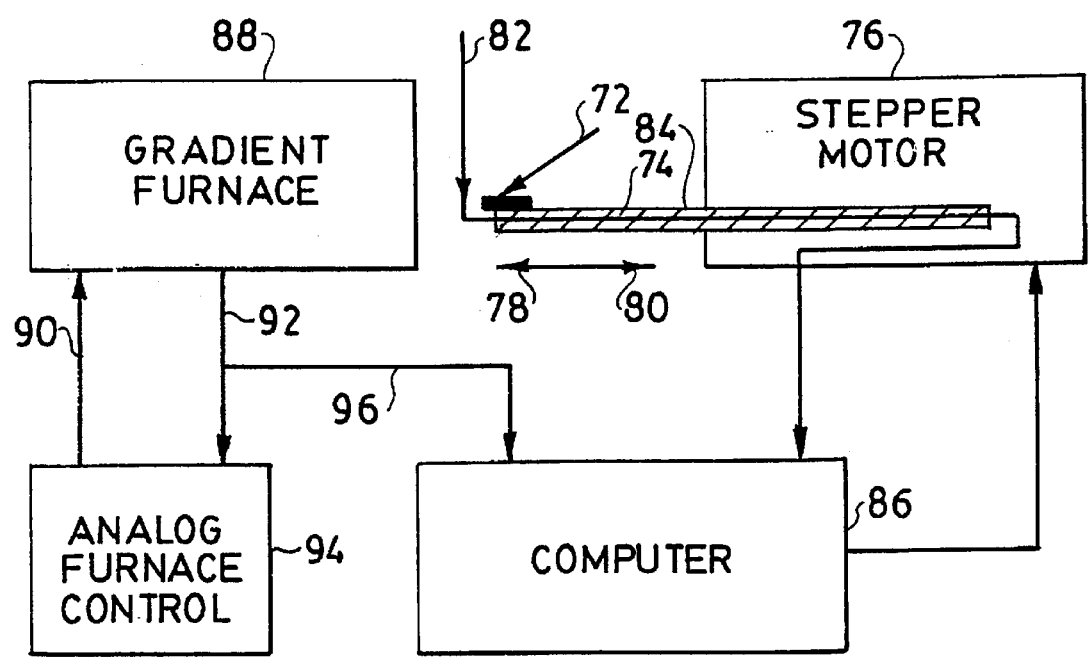

FIG. 2 is a schematic diagram of a submicron precursor powder fabrication process. Referring to FIG. 2, an aerosol generator 50 is used to produce droplets of precursor salt plus fuel solution. Carrier gas flowing through line 52 is used to sweep the droplets in droplet classifier 54. Small droplets leaving classifier 54 flow through line 56 to drying column 58. Dried particles are passed via line 60 to particle collector 62.

In one preferred embodiment, the aerosol generator is a commercial humidification unit operating at 60 watts maximum power and 167 kilohertz. In this embodiment, a piezoelectric transducer (not shown) is isolated beneath a Mylar diaphragm (not shown) to prevent direct contact between the precursor salt/fuel solution in the aerosol (not shown) and the transducer. The aerosol generator 50 is comprised of a gas inlet port (not shown) for the introduction of a metered, pressure-regulated, filtered carrier gas (introduced via line 52); the flowing carrier gas thus introduced is then mixed with the atomized precursor salt and nitrogen-containing fuel solution droplets, thereby sweeping the droplets into the droplet classification section 54.

In one preferred embodiment, the droplet classifier 54 is effectively a continuous sedimentation device, in which the droplet-containing stream of flowing carrier gas is directed vertically upward. In this embodiment, large droplets are removed by sedimentation, while small droplets are entrained in the gas leaving the classifier 54. A classified droplet-containing gas stream, with an average aerosol droplet size significantly smaller than that of the as-generated aerosol droplets, will then enter the drying column 58.

In one preferred embodiment, the drying column is a diffusion dryer and consists of two pipes (not shown) placed in a concentric, annular arrangement. In this embodiment, the inner pipe is porous, and the outer pipe is gas tight. The annular gap will be filled with a dessicant (such as molecular sieve material 4A, which may be obtained from the U.O.P. Molecular Sieves of 25111 Country Club Blvd., North Olmstead, Ohio) to remove water vapor liberated by the aerosol drops; other conventional dessicants also may be used. Dried precursor salt/fuel particles in a low (or nearly zero, in most cases) humidity carrier gas stream will emerge from the drying column, where they will be collected.

In one preferred embodiment, the dried precursor salt/fuel particles are collected on a 0.22 micron filter contained in a suitable filter housing with the aid of a rough vacuum applied to the downstream side of the filter.

The second step of the nanoparticle production process provides the ignition of the submicron precursor powders which, in one embodiment, consist of a vigorous mixture whose composition is strictly analogous to that of gunpowder. Upon rapid heating, a highly exothermic and rapid chemical reaction occurs that raises the temperature of the particles, causes formation of a target ceramic material to take place, and generates a large amount of gas, leading to nearly instantaneous disintegration of the precursor particles as the nanoparticles are formed.

In one preferred embodiment, not shown, after particle formation by combustion synthesis, the nanoparticles are coated by a vapor- or liquid-phase deposition technique. In this embodiment, the nanoparticles are placed in a chamber that is filled with coating material vaporized by an evaporation method.

In one embodiment, the coating materials used may contain a cation or a mixture of cations which are capable of being converted into a transition metal oxide(s) by precipitation and heat. By way of illustration and not limitation, one may add from about 0.001 to about 2.0 weight percent of the transition metal as a solution of the nitrate, the sulfate, the carbonate, the chloride, the oxalate, the acetate, the hydroxide, etc. as the transition-metal-containing compound, provided that the transition-metal-containing compound is preferably soluble in the preferred solvent and is capable of being precipitated and being Converted to the oxide.

In one preferred embodiment, the combusted powder is dispersed in deionized water. In this embodiment, the pH of the dispersion is adjusted (with, e.g., ammonium hydroxide, nitric acid, and the like) and then subjected to ball milling. Excess carbonate ion is added to the mixture by dissolving from about 1 to about 5 weight percent of ammonium carbonate. Thereafter, a transition-metal-containing solution (such as from about 0.1 to about 4.0 weight percent of lanthanum nitrate and from about 0.04 to about 0.1 weight percent of manganese nitrate, dissolved in deionized water) is added to the slurry containing the combusted powder. As those skilled in the art are aware, the carbonate ion readily precipitates transition metal cations from the slurry, and the transition metal carbonate salt is readily converted to the oxide by heat.

Without wishing to be bound to any particular theory, applicants believe that during the sintering process the transition metal oxides can preferentially incorporate in the crystal lattice of the combusted powder as dopants or preferentially segregate to the grain boundaries of the sintered product as counter-dopants, depending on compatibility with the crystal lattice of the material.

Applicants also believe that the dopants and the counter-dopants can affect the localized grain or grain-boundary oxidation states of the sintered oxide material. As those skilled in the art will appreciate, the oxidation state of a material can affect its dielectric, conductive, or semi-conductive behavior.

In one preferred embodiment, a sol-gel process is used to coat the combusted powder. The precursor to the sol-gel coating material can be a metal alkoxide. These alkoxides are easily hydrolyzed, and the network-forming elements (silicon, boron, titanium, and the like) can be polymerized to form a gel rather than a precipitate. The metal hydroxide is first hydrolyzed, replacing the $OR^-$ with $OH^-$ in the $M(OR)_n$ metal alkoxide. The metal hydroxide is then condensed to form monomers ($[MO]^-$) which combine to form trimers, chains, rings, etc. and finally link to form a three-dimensional network.

In one preferred embodiment, the combusted powder is ball-milled in a sol-gel forming solution containing from about 0.5 to about 5.0 mole percent of tetraethyl orthosilicate in deionized water. The dispersed slurries are dried by evaporation at 40 degrees centigrade with constant stirring to avoid segregation.

Deposition of uniform sol-gel coatings can aid in the ability to control the surface charge of the particles, allow for faster rearrangement of particles during the first stages of liquid-phase sintering, reduce the time required for complete sintering, and aid in the homogenization of the distribution of dopants around the particles.

Referring again to FIG. 1, after the combusted particles have been ground and formed, they are preferably fired in furnace 46 with a specified fast-firing sequence.

Fast-firing is a form of rate-controlled sintering which utilizes a short soak time (in the range of 10 minutes or less) at high temperatures to achieve rapid densification; the theory of fast firing is known to those skilled in the art. Thus, e.g., a survey article on fast firing, entitled "Theory of Fast Firing," was published by Georges J. Ghorra in Ceram. Eng. Sci. Proc. 14[1–2] pp. 77–115 (1993).

Many apparatuses suitable for fast-firing have been described in the prior art; and they may be used in applicants' process. Thus, e.g., a gradient furnace and "smart pusher" system was described in a publication by S. M. Landin entitled "Processing and Properties of Fast Fired Zinc Modified Lead Magnesium Niobate Relaxor Dielectrics," Alfred University M.S. Thesis, U.S.A., 14–30 (1989).

In one preferred embodiment, the gradient furnace/"smart pusher" system described in the Landin thesis is used in the process of this invention. This system is illustrated schematically in FIG. 3.

Referring to FIG. 3, the sample 72 to be fired may be disposed on the end of movable support 74, which is operatively connected to a lead screw drive (not shown) connected to stepper motor 76. The operation of stepper motor 76 causes the sample 72 to move in the direction of arrow 78, or of arrow 80.

A thermocouple 82 is also located at the end of movable support 74, and it is connected via line 84 to computer 86.

The sample 72 is movable in and out of a gradient furnace 88, which is electrically connected (via lines 90 and 92) to a furnace controller 94. Furnace controller 94 is also electrically connected to computer 86 by line 96.

A time-temperature profile is entered in control software in computer 86. When a difference in program temperature and thermocouple temperature is detected, the stepper motor 76 is activated to move the sample to hotter or cooler regions of the gradient furnace. By varying the position and rate of change of position, the sample can be heated or cooled at programmed rates and held at programmed isothermal soak temperatures.

Preparation of ultra-fine barium hexaferrite powder

In one preferred embodiment, the ultra-fine powder made is barium hexaferrite powder. Via this process, a pure powder which is substantially homogeneous is produced.

The precursor mixture in mixer 10 contains both barium ions and trivalent ferric ions; 12 moles of ferric ion are present for each mole of barium ion.

The barium ion, and the ferric ion, may be added to water (or other suitable solvent), preferably in the form of a water-soluble compound. Thus, barium nitrate and ferric nitrate may be used to introduce these ions into the water.

A sufficient amount of the barium ion and the ferric ion is introduced so that the $Ba^{2+}$ and $Fe^{3+}$ ions in a ratio of 1:12 are present in the water in a total cation concentration of from about 0.005 to about 0.1 molar; thus, sufficient ion is present that, assuming complete conversion of the starting material to the final product, from about 0.005 to about 0.1 moles of barium hexaferrite is formed per liter of starting solution.

After the introduction of the cations, the nitrogen-containing fuel is then introduced into the system. Generally from about 20 to about 40 weight percent of such fuel, by dry weight of all solids in the system, is added to the reaction mixture.

The pH of the mixture is then adjusted to from about 1 to about 3 and, more preferably, to about 2. It is convenient to use nitric acid (1.0 normal) for this purpose, for it is believed that the nitrate ion participates in the anionic oxidation-reduction reaction.

The precursor mixture is then formed into droplets and spray dried; and the dried particles are then ignited.

The ignited particles are then calcined while preferably being contacted with from about 0.5 to about 5.0 liters per minute of flowing air or oxygen (and, more preferably, to about 1 liter per minute of flowing air or oxygen). During this calcination, the temperature of the particles is raised from ambient to a temperature of from about 800 to about 1,000 degrees centigrade (and, preferably, about 900 degrees centigrade) at a rate of from about 100 to about 300 degrees centigrade per hour, and then the particles are allowed to "soak" at this temperature for at least about 30 minutes (and, preferably, for at least about 1 hour). The particles are then cooled to ambient at a rate of from about 100 to about 300 degrees centigrade per hour.

The calcined particles are then preferably milled in, e.g., a mortar and pestle or a ball mill attritor until at least about 90 weight percent of the particles are smaller than about 15 microns. The particles are then formed into a green body, preferably by pressing in a uniaxial die press at a pressure of from about 20 to about 100 megapascals.

The green body thus formed is sintered. The temperature of the green body is raised from ambient to a temperature of from about 1,200 to about 1,400 degrees centigrade at a rate of from about 100 to about 500 degrees centigrade per minute, thereafter allowed to soak for at least two minutes (and preferably at least three minutes) at this temperature, and then cooled to ambient at a rate of from aboout 100 to about 400 degrees centigrade per minute.

The following examples are presented to illustrate the claimed invention but are not to be deemed limitative thereof. Unless otherwise specified, all parts are by weight, and all temperatures are in degrees centigrade.

EXAMPLE 1

40.79 cubic centimeters of zirconium oxynitrate solution (obtained from Magnesium Elektron Inc. of 500 Point Breeze Road, Flemington, N.J.), and 2.92 grams of yttrium nitrate pentahydrate (Aldrich catalog number 23,795-7) were charged to a beaker, and a sufficient amount of distilled water was added to make a one-liter solution. The mixture was mixed until a clear solution was obtained. To this solution was added 4.43 grams of oxalic dihydrazide (obtained from Aldrich as catalog number 13,129-6). Mixing with a magnetic stirrer occurred for 60 minutes until a clear solution was produced.

A Virtis Lab-Plant Spray Dryer (manufactured by the Virtis Company, Inc. of Route 208, Gardiner, N.Y.) equipped with an integral self-priming peristaltic pump and an atomizer was used to draw liquid from the beaker into the main chamber of the dryer, atomize such liquid, and dry it; the drying occurred over a period of a few seconds. Thirteen grams of dried powder with an average particle size smaller than 5 microns were obtained when the spray dryer was operated for 7 hours.

A hot plate manufactured by the Barnstead/Thermodyne Company of 2555 Kepper Blvd., Dubuque, Iowa (model number SP46925) was heated to a temperature of 450 degrees centigrade. When it reached such temperature (as indicated by a thermocouple located on the top surface of the hot plate), a glass beaker was placed on such top surface and allowed to reach the temperature of the hot plate over a period of 5 minutes. Thereafter, a portion of dried powder was charged into the beaker; ignition and combustion of the dried powder occurred substantially instantaneously. The process was repeated until all of the dried powder had been combusted.

The specific surface area of the combusted powder was measured by the BET nitrogen adsorption technique; the powders were found to have a specific surface area of 35 square meters per gram.

X-Ray diffraction analysis of the combusted powders was conducted. Analysis indicated a structure consistent with that of cubic zirconia.

Portions of the combusted powder were separately charged to a mortar and pestle and hand-ground for 3.0 minutes; the process was repeated until a sufficient amount of ground powder to make desired green bodies had been obtained. The ground powder was pressed into the shape of a cylindrical pellet with a diameter of 1 centimeter.

A fast-firing tube furnace with an inside diameter of about 55 millimeters was preheated until the temperature of the outside surface of the tube was 1,535 degrees centigrade. A cylindrical pellet was inserted into such furnace so that it was heated at a rate of 250 degrees centigrade per minute from ambient temperature to a temperature of about 1,400 degrees centigrade. Thereafter, the pellet was maintained in the furnace for 10 minutes and then removed and allowed to cool.

The fired pellet had a density of 5.41 grams per cubic centimeter.

EXAMPLE 2

The procedure of Example 1 was substantially followed with the exception that 3.0 grams of the ground powder were dispersed in 100 milliliters of distilled water and nitric acid was added to the dispersion to adjust its pH to 2.0. Thereafter, the dispersion was comminuted with a sonic probe to deagglomerate the powder. Thereafter, the deaggglomerated mixture was centrifuged at 800 revolutions per minute in a "Model K" centrifuge manufactured by the International Equipment Company of Needham Heights, Mass. The supernatant liquid containing particles smaller than 0.6 microns was then collected, and water was evaporated. The particles thus obtained were then crushed in a mortar and pestle for 2.0 minutes and processed in accordance with the procedure of Example 1, with the exception that the sample was fired at a temperature of 1,400 degrees centigrade for 2.0 minutes. The fired body had a density of 6.06 grams per cubic centimeter.

EXAMPLE 3

The procedure of Example 2 was substantially followed, with the exception that the firing temperature was 1,350 degrees centigrade and the firing time was 2.0 minutes. The fired pellet had a density of 5.596 grams per cubic centimeter.

EXAMPLE 4

The procedure of Example 1 was substantially followed with the exception that the powder was not crushed again in a mortar and pestle. The fired pellet had a density of 4.54 grams per cubic centimeter.

EXAMPLE 5

4.44 grams of zirconyl nitrate powder (Aldrich catalog number 24,349-3) and 0.584 grams of yttrium nitrate pentahydrate (Aldrich catalog number 23,795-7) were charged to a beaker containing 200 milliliters of distilled water to produce a solution containing 0.1 moles per liter of salts per liter; mixing of this mixture occurred until a substantially clear solution was obtained.

To this mixture was added 0.558 grams of the oxalic dihydrazide reagent described in Example 1. Mixing occurred with a magnetic stirrer for 30 minutes.

The solution thus obtained was fed to the inlet port of a DeVilbiss "Ultra-Neb 99" ultrasonic nebulizer (manufactured by DeVilbiss Health Care Inc. of Somerset, Pa.) and atomized in such nebulizer. Droplets, most of which were in the 0.5 to 5 micron range, were produced.

Air was brought into contact with the droplets at a flow rate of 1 standard cubic foot per hour, and it transported such droplets into a classifier and, thereafter, into a drying column. The drying column was a diffusion dryer which consisted of two pipes placed in a concentric, annular arrangement; the inner pipe was porous, and the outer pipe was gas tight. The annular gap was filled with a dessicant (Molecular Sieve 4A).

0.06 grams of dried powder were collected on a 0.22 micron filter contained in a filter housing. Over a period of 5 hours of operation, the powder was collected on the filter with the aid of a mild vacuum applied to the downstream side of the filter.

The dried powder was then processed in accordance with the procedure of Example 1, being ignited with such procedure. The combusted powder had a specific surface of 20 square meters per gram.

EXAMPLE 6

The procedure of Example 1 was substantially followed, with the exception that the dry powder was ignited and combusted at 550 degrees centigrade. Its surface area, as measured by the BET nitrogen adsorption technique, was 52.35 square meters per gram.

A portion of the powder was ground with a mortar and pestle for 3 minutes. The surface area of the powder so ground, as measured by the BET nitrogen adsorption technique, was 58.3 square meters per gram.

EXAMPLE 7

Eight grams of zirconyl nitrate hydrate powder (obtained from Aldrich as catalog number 24,349-3) were added to 360 milliliters of deionized water. The mixture was stirred until a clear solution was obtained. Thereafter, 0.526 grams of yttrium nitrate pentahydrate powder (obtained from Aldrich as catalog number 23,795-7) were added to the solution; the mixture was then stirred until all of the powder had dissolved. Thereafter 1.504 grams of oxalic dihydrazide (obtained from Aldrich as catalog number 13,129-6) were added. Mixing with a magnetic stirrer then occurred for 3 hours until a clear solution was obtained.

The aforementioned Virtis Lab-Plant Spray Dryer was used to atomize and dry the solution so produced. The inlet air temperature was adjusted to 160 degrees centigrade, and the solution feed rate was adjusted to result in an exhaust air outlet temperature of not less than 95 degrees centigrade. The powder collected had an average particle size of less than 5 microns.

0.2 grams of the dried powder were charged into an 11 millimeter diameter die. The powder was uniaxially pressed at 1,000 pounds to form a pellet. The pellet was combusted in a beaker on a 400 degrees centigrade hot plate; and it combusted from the edges inward over a period of 30 seconds. Fragments burst out from the combusting edges. A loose powder was left after combustion was complete.

The specific surface area of the combusted powder was measured by the BET nitrogen adsorption technique. The powder was found to have a specific surface area of 45 square meters per gram.

X-ray diffraction analysis of the combusted powders was conducted. Analysis indicated a structure consistent with that of cubic zirconia.

EXAMPLE 8

7.135 grams of titanium isopropoxide solution (obtained from Aldrich as catalog number 20,527-3) were added to 250 milliliters of deionized water. 7 milliliters of nitric acid (obtained from Fisher as catalog number A200-500) were added to the slurry. The slurry was mixed with a magnetic stirplate for 5 hours (at room temperature) until a clear solution of the titanium nitrate was obtained.

6.53 grams of barium nitrate (obtained from Aldrich as catalog number 21,758-1) were ground for two minutes with a mortar and pestle. The ground powder was added to the titanium nitrate solution. A clear mixture of the nitrate salts of barium and titanium was obtained after less than ten minutes of stirring.

1.02 grams of oxalic dihydrazide (obtained from Aldrich as catalog number 13,129-6) were ground for 2 minutes with a mortar and pestle. The ground oxalic dihydrazide was added to the nitrate salt solution. The mixture of oxalic dihydrazide and the nitrate salts of barium and titanium dissolved into a yellow solution after stirring of less than 30 minutes.

A Virtis Lab-Plant Spray Dryer (manufactured by the Virtis Company, Inc. of Route 208, Gardiner, N.Y.) equipped with an integral, self-priming peristaltic pump and an atomizer, was used to draw liquid from the beaker into the main chamber of the dryer, atomize such liquid, and dry it; the drying operation occurred over a period of 0.5 hours. The air inlet of the dryer was controlled at 150 degrees centigrade, and the solution feed rate was adjusted to maintain an exhaust air temperature of 99 degrees centigrade. Three grams of an orange precursor powder with an average particle size of less than 5 microns were collected.

A 50 milliliter beaker was preheated to 650 degrees centigrade on a hot plate manufactured by the Barnstead/ Thermodyne Company of 2555 Kepper Blvd., Dubuque, Iowa (model number SP46925); beaker temperature was indicated by a thermocouple located on the contact surface between the beaker and the hot plate. Thereafter, a portion of dried powder was charged into the beaker; ignition and combustion of the dried precursor powder occurred substantially instantaneously. Brown smoke was evolved. The process was repeated until all of the precursor powder had been combusted to a fine white powder.

The specific surface area of the combusted powder was measured by the BET nitrogen adsorption technique. The powder was found to have a specific surface area of 16.5 square meters per gram.

X-ray diffraction analysis of the combusted powder was conducted. Analysis indicated a structure consistent with that of a mixture of barium nitrate and cubic barium titanate.

EXAMPLE 9

The procedure of Example 4 was substantially followed, with the exception that 2.4 grams of the oxalic dihydrazide fuel was added, and the dried precursor was combusted at temperatures between 420 and 600 degrees centigrade. The resulting powder had a specific surface area of 5.95 square meters per gram. X-ray analysis indicated a structure similar to that obtained in Example 4, with the exception of an increased barium titanate/barium nitrate ratio.

EXAMPLE 10

A solution identical to that prepared in the experiment of Example 5 was atomized in a DeVilbiss "Ultra-Neb 99" ultrasonic nebulizer (manufactured by the DeVilbiss Health Care Inc. of Somerset, Pa.). Filtered air at 1 atmosphere pressure was caused to flow through the nebulizer chamber at 15 standard cubic feet per hour, carrying solution droplets into the classifier and thereafter into the diffusion dryer.

The diffusion dryer consisted of four parallel drying columns. Each drying column consisted of two pipes in a concentric annular arrangement; the inner pipes were porous, and the outer pipes were gas tight. The annular gaps were filled with a dessicant. The four drying columns held a total of 11 kilograms of dessicant. Droplets had a dryer column residence time of 12.6 minutes. Rough vacuum was applied to a 0.2 micron filter to collect dried particles at the exhaust port of the dryer. Two grams of yellow powder with an average particle size of less than 2 microns was obtained. The collected powder was combusted in accordance with the procedure of Example 5.

X-ray diffraction analysis of the combusted powder indicated the presence of structures similar to that obtained in the experiment of Example 4 (a mixture of barium nitrate and barium titanate).

The specific surface area of the combusted powder was measured by the BET nitrogen adsorption technique. The powders were found to have a specific surface area of 7.15 square meters per gram.

EXAMPLE 11

The procedure of Example 4 was substantially followed, with the exception that a total of 4.8 grams of the oxalic dihydrazide fuel was used, and the dried precursor was combusted at temperatures between 425 and 650 degrees centigrade. The resulting powder had a specific surface area of 6.15 square meters per gram. X-ray diffraction analysis indicated structures of barium titanate and barium carbonate.

EXAMPLE 12

In substantial accordance with the procedure of Example 1, to 100 milliliters of water was added 1.307 grams of barium nitrate (Fisher's reagent number B53-500), and the mixture was then stirred for 5 minutes. 24.24 grams of iron nitrate nonahydrate (Aldrich's reagent number 21,682-8) were then added to the mixture, and the mixture was then stirred for 10 minutes. 10,949 grams of oxalic dihydrazide were then added to the mixture, followed by 205 milliliters of nitric acid (1 normal) to adjust the pH of the mixture to 2; 90 milliliters of water were then added to the mixture. The mixture was then stirred for 15 minutes.

The precursor was then formed into droplets and spray dried in accordance with the procedure of Example 1. The dried particles were then collected and ignited at a temperature of 550 degrees centigrade on a hot plate.

The ignited particles were calcined in air flowing at 1 liter per minute by raising their temperature at a rate of 200 degrees centigrade per hour to 900 degrees, allowing the particles to soak at 900 degrees centigrade for 1 hour, and then cooling the mixture to ambient at a rate of 300 degrees centigrade per hour. X-ray diffraction analysis showed that the material consisted substantially of barium hexaferrite.

The calcined powder was pressed into a pellet at a pressure of 40 megapascals using a uniaxial laboratory die press (Model C, Fred S. Carver, Inc., Menomonee Falls, Wis.) The pellet was then sintered by raising its temperature from ambient to a temperature of 1,350 degrees centigrade at a rate of 250 degrees centigrade per minute, soaked at this temperature for 5 minutes, and then cooled at a rate of 250 degrees centigrade per minute. Each of the sintering steps occurred under ambient atmosphere.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

We claim:

1. A process for producing ultra-fine barium hexaferrite particles, comprising the steps of:

(a) forming droplets of a ceramic precursor mixture containing a barium ion and trivalent ferric ion in the molar ratio of 1:12, a nitrogen-containing fuel, a solvent, and an anion capable of participating in an anionic oxidation-reduction reaction with the nitrogen containing fuel, wherein said nitrogen-containing fuel is of the formula $R.(HA)_a$, and wherein:

1. a in an integer of from 0 to 2,
2. HA is selected from the group consisting of $HNO_3$, HCl, HBr, HI, $H_2SO_4$, $H_2O$, and $CH_3COOH$,
3. R is of the formula

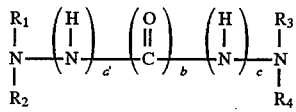

wherein: $R_1$, $R_2$, $R_3$, and $R_4$ are independently selected from the group consisting of hydrogen, alkyl of from 1 to 4 carbon atoms, and phenyl, a' is an integer of from 0 to 2, b is an integer of from 1 to 2, c is c is an integer of from 0 to 2, and a' plus c is at least 1;

(b) removing at least about 85 weight percent of the solvent from the droplets of the ceramic precursor mixture to form particles comprising the metal cations, the anion, and the nitrogen-containing fuel, thereby producing dried particles; and (c) subjecting said dried particles to a temperature of from about 400 to about 600 degrees centigrade and an atmosphere with a relative humidity of less than about 60 percent, thereby causing said particles to react in a vigorous manner and to form a combusted powder.

2. The process as recited in claim 1, further comprising the steps of:

(a) milling said combusted powder until substantially all of the particles of such powder are smaller than about 0.5 microns, thereby forming a milled combusted powder;

(b) forming said milled combusted powder into a green body;

(c) heating said green body from ambient to a temperature of from about 1,100 to about 1,440 degrees centigrade at a rate of from about 10 to about 750 degrees centigrade per minute and, thereafter, maintaining said green body at a temperature of from about 1,100 to about 1,450 degrees centigrade for at least about 0.5 minutes.

3. The process as recited in claim 1, wherein said anion is nitrate ion.

4. The process as recited in claim 1, wherein said solvent consists essentially of water.

5. The process as recited in claim 1, wherein at least about 80 weight percent of said droplets have a maximum dimension of about 6 microns.

6. The process as recited in claim 1, wherein said dried particles comprising the metal cations, the anion, and the nitrogen-containing fuel are heated to a temperature of from about 500 to about 600 degrees centigrade.

7. The process as recited in claim 1, wherein said combusted powder is formed into a pellet and, thereafter, heated to a temperature of from about 275 to about 750 degrees centigrade.

8. The process as recited in claim 1, wherein said combusted powder is coated with a material capable of being converted into a transition metal oxide by precipitation and heat.

9. The process as recited in claim 8, wherein said material is comprised of a transition metal compound selected from the group consisting of the nitrate, the sulfate, the carbonate, the chloride, the oxalate, the acetate, and the hydroxide of a transition metal.

10. The process as recited in claim 5, wherein said combusted powder is dispersed in a slurry containing water, carbonate ion, and a transition metal compound.

11. The process as recited in claim 1, wherein said combusted powder is milled in a sol-gel forming solution.

12. The process as recited in claim 11, wherein said sol-gel forming solution is comprised of tetraethyl orthosilicate.

* * * * *